United States Patent
Kuge et al.

(10) Patent No.: US 9,269,718 B1
(45) Date of Patent: Feb. 23, 2016

(54) MANUFACTURING METHOD OF SEMICONDUCTOR MEMORY DEVICE

(71) Applicant: KABUSHIKI KAISHA TOSHIBA, Minato-ku (JP)

(72) Inventors: Nobuhito Kuge, Yokkaichi (JP); Hiroshi Akahori, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/657,174

(22) Filed: Mar. 13, 2015

Related U.S. Application Data

(60) Provisional application No. 62/046,399, filed on Sep. 5, 2014.

(51) Int. Cl.
  *H01L 21/8234* (2006.01)
  *H01L 27/115* (2006.01)
  *H01L 21/311* (2006.01)

(52) U.S. Cl.
  CPC .... *H01L 27/11524* (2013.01); *H01L 21/31105* (2013.01); *H01L 27/1157* (2013.01)

(58) Field of Classification Search
  CPC .................. H01L 27/1157; H01L 21/31105
  USPC ......................................................... 438/275
  See application file for complete search history.

(56) References Cited

U.S. PATENT DOCUMENTS

| 7,977,751 B2 | 7/2011 | Nagaoka et al. |
| 2003/0094635 A1* | 5/2003 | Yaegashi ........... H01L 21/28273 257/250 |
| 2012/0139024 A1* | 6/2012 | Toba ................. H01L 27/11524 257/316 |

FOREIGN PATENT DOCUMENTS

| JP | 2001-196454 | 7/2001 |
| JP | 2009-283527 | 12/2009 |
| JP | 5212278 | 6/2013 |

* cited by examiner

*Primary Examiner* — Bradley K Smith
(74) *Attorney, Agent, or Firm* — Oblon, McClelland, Maier & Neustadt, L.L.P.

(57) ABSTRACT

In accordance with an embodiment, a manufacturing method of a semiconductor device includes: forming memory cells and select transistors on a semiconductor substrate configured to select any memory cell, forming a first insulating nitride film, forming a contact, and selectively removing the first insulating nitride film. The first insulating nitride film is formed so as to cover the semiconductor substrate between the select transistors adjacent in the first direction, the select transistors, and the memory cells. The first insulating nitride film is selectively removed in a region other than the region in which the contact is formed and in a region above the select transistors or the memory cells.

8 Claims, 8 Drawing Sheets

MANUFACTURING METHOD OF SEMICONDUCTOR MEMORY DEVICE

CROSS REFERENCE TO RELATED APPLICATIONS

This application is based upon and claims the benefit of U.S. provisional Application No. 62/046,399, filed on Sep. 5, 2014, the entire contents of which are incorporated herein by reference.

FIELD

Embodiments described herein relate generally to a manufacturing method of a semiconductor memory device.

BACKGROUND

Heretofore, NAND flash memories have been reduced in cost and increased in capacitance by miniaturization.

Due to recent further miniaturization, there is a possibility that an impurity may remain around a memory cell, which leads to the problem of deteriorated operation accuracy of the memory cell.

DETAILED DESCRIPTION

In accordance with an embodiment, a manufacturing method of a semiconductor device includes: forming a plurality of memory cells and a plurality of select transistors on a semiconductor substrate configured to select any memory cell to record or read and to have gate parts in which an impurity is introduced, forming a first insulating nitride film, forming a contact, and selectively removing the first insulating nitride film. The memory cells and the select transistors are formed in such a manner that the memory cells are connected in series in the first direction, that the select transistors are connected in series to the memory cells in the first direction, and that the memory cells and the select transistors are arranged at predetermined intervals in a second direction that intersects with the first direction.

The first insulating nitride film is formed so as to cover the semiconductor substrate between the select transistors adjacent in the first direction, the select transistors, and the memory cells.

The contact is formed so as to contact the semiconductor substrate in a removed part formed by partly removing the first insulating nitride film between the select transistors adjacent in the first direction.

The first insulating nitride film is selectively removed in a region other than the region in which the contact is formed and in a region above the select transistors or the memory cells.

Embodiments will now be explained with reference to the accompanying drawings. Like components are provided with like reference signs throughout the drawings and repeated descriptions thereof are appropriately omitted. It is to be noted that the accompanying drawings illustrate the invention and assist in the understanding of the illustration and that the shapes, dimensions, and ratios and so on in each of the drawings may be different in some parts from those in an actual apparatus.

In the specification of the present application, "stacking" not only includes stacking layers in contact with each other but also includes staking layers with another layer interposed in between. "Providing on" not only includes providing a layer in direct contact with a layer but also includes providing a layer on a layer with another layer interposed therebetween. Moreover, terms indicating directions such as "upper" and "lower" in the explanation show relative directions when a wiring formation side in a given layer on a later-described substrate is set as the top. Therefore, the directions may be different from actual directions based on gravitational acceleration directions.

(1) First Embodiment (Device Configuration)

A schematic configuration of a semiconductor memory device manufactured by a manufacturing method of a semiconductor device according to a first embodiment when applied to a NAND type flash memory device is described with reference to FIG. 1 to FIG. 3.

Figure 1:
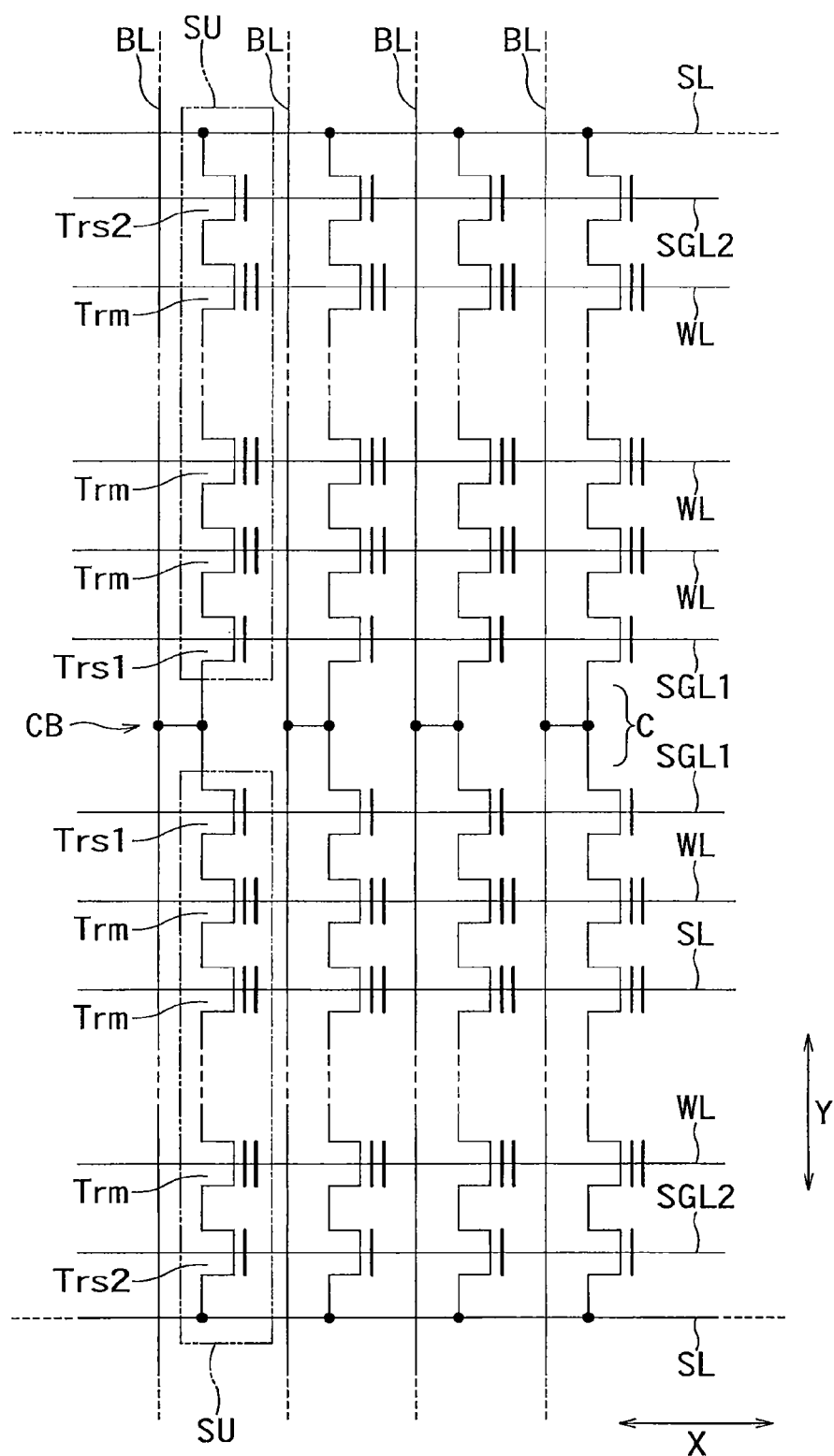
FIG. 1 shows an example of an equivalent circuit diagram of part of a memory cell array formed in a memory cell region of a semiconductor memory device according to a first embodiment.

FIG. 1 shows an example of an equivalent circuit diagram of part of a memory cell array formed in a memory cell region of a NAND type flash memory device according to the present embodiment.

The semiconductor memory device shown in FIG. 1 includes a plurality of NAND cell units SU arranged in matrix form in an X-direction (word line direction) and a Y-direction (bit line direction) that intersects at right angles with the X-direction. In the present embodiment, the Y-direction corresponds to, for example, a first direction, and the X-direction corresponds to, for example, a second direction.

Each of the NAND cell units SU has two select gate transistors Trs1 and Trs2, and a plurality of memory cell transistors Trm connected in series between the select gate transistors Trs1 and Trs2. The adjacent memory cell transistors Trm in the NAND cell unit SU share a source/drain region (see FIG. 3). Although not particularly shown, dummy memory cells such as redundant circuits are generally provided as needed in addition to the above memory cell transistors.

The memory cell transistors Trm arrayed in the X-direction in FIG. 1 are connected by a common word line WL. The select gate transistors Trs1 arrayed in the X-direction in FIG. 1 are connected by a common select gate line SGL1, and the select gate transistors Trs2 are connected by a common select gate line SGL2.

A bit line contact CB is connected to a drain region of the select gate transistor Trs1. This bit line contact CB is connected to a bit line BL extending in the Y-direction in FIG. 1. The select gate transistor Trs2 is connected to a source line SL extending in the X-direction in FIG. 1 via a source region.

Figure 2:
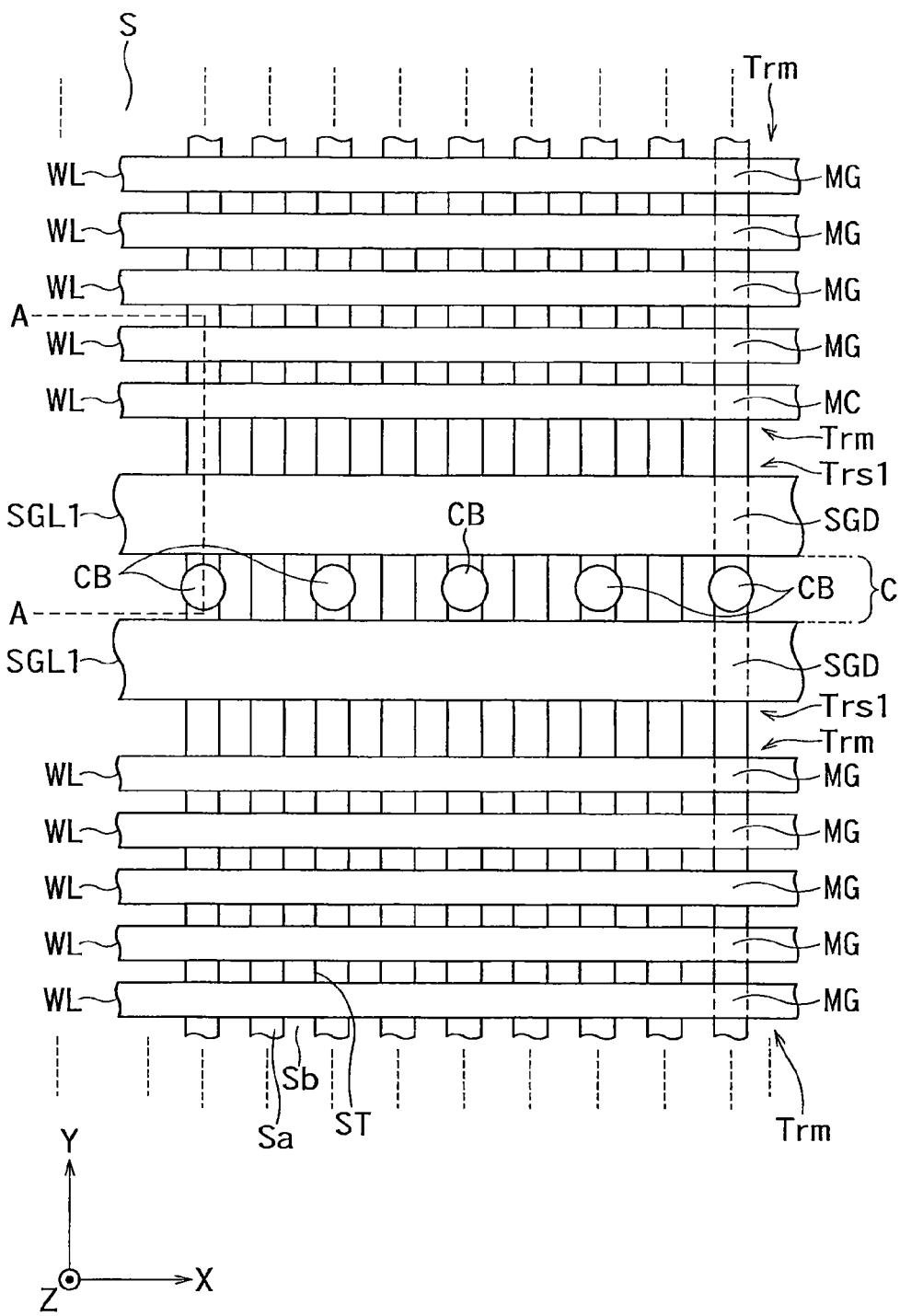
FIG. 2 is a plan view showing an example of a layout pattern in part of the memory cell region of the semiconductor memory device shown in FIG. 1.

FIG. 2 is a plan view showing an example of a layout pattern in part of the memory cell region of the semiconductor memory device shown in FIG. 1. In a semiconductor substrate S having a semiconductor layer on its surface, an element isolation region Sb having a shallow trench isolation (STI) structure in which an element isolation trench ST is filled with an insulating film is formed to extend along the Y-direction in FIG. 2. A plurality of element isolation regions Sb are formed at predetermined intervals in the X-direction in FIG. 2. Thus, an element region Sa is formed so as to extend along the Y-direction in FIG. 2, and a plurality of element regions Sa are formed in the X-direction in an electrically isolated state.

A word line WL is formed so as to extend along a direction (the X-direction in FIG. 2) that intersects at right angles with the element regions Sa. A plurality of word lines WL are formed at predetermined intervals in the Y-direction in FIG. 2. A memory cell gate electrode MG (see FIG. 3) of the memory cell transistor Trm is formed above the element region Sa that intersects with the word line WL.

As shown in FIG. 1, the memory cell transistors Trm adjacently connected in series in the Y-direction constitute part of a NAND string (memory cell string). The select gate transistors Trs1 and Trs2 are provided adjacent to both outer sides of the memory cell at the end of the NAND string in the Y-direction.

A plurality of select gate transistors Trs1 are provided in the X-direction, and select gate electrodes SGD (see FIG. 2 and FIG. 3) of the select gate transistors Trs1 are electrically connected by the select gate line SGL1. The select gate electrodes SGD of the select gate transistors Trs1 are configured on the element regions Sa that intersect with the select gate line SGL1.

A plurality of select gate transistors Trs2 are provided in the X-direction, and select gate electrodes (not particularly shown in FIG. 2 and FIG. 3) of the select gate transistors Trs2 are electrically connected by the select gate line SGL2. Select gate electrodes (not shown) are also configured on the element regions Sa that intersect with the select gate line SGL2.

As shown in FIG. 1, a bit line contact region C (see FIG. 2 and FIG. 3) is provided between the select gate transistors Trs1-Trs1 of the NAND cell units SU adjacent in the Y-direction. A plurality of bit line contacts CB are formed in the bit line contact region C.

A plurality of bit line contacts CB are respectively formed on a plurality of element regions Sa. One bit line contact CB is formed on the element region Sa between the adjacent select gate transistors Trs1-Trs1. Although not particularly shown, a source line contact is formed on the element region Sa between a pair of select gate lines SGL2-SGL2.

Figure 3:
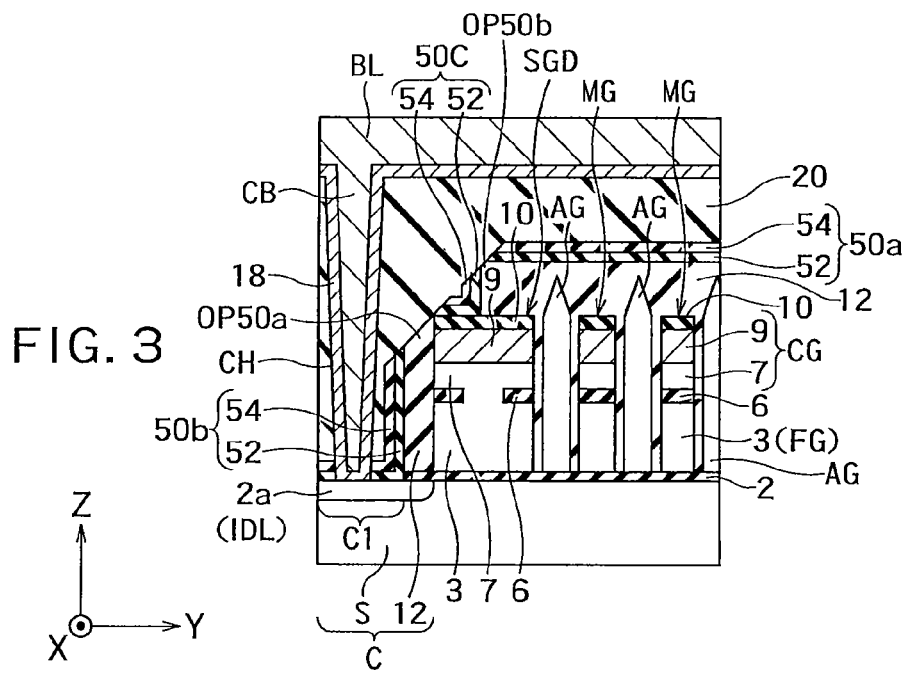
FIG. 3 schematically shows a sectional structure along the line A-A in FIG. 2.

FIG. 3 schematically shows a sectional structure along the line A-A in FIG. 2. FIG. 3 schematically shows the Y-direction sectional structures of one of a pair of select gate transistors Trs1-Trs1, part of the memory cell transistor Trm connected in series to the above select gate transistors Trs1, and the bit line contact CB between the select gate transistors Trs1-Trs1.

As shown in FIG. 3, a tunnel oxide film 2 is formed on the semiconductor substrate (e.g. a p-type silicon substrate) S. The tunnel oxide film 2 is formed by the use of, for example, a silicon oxide film ($SiO_2$), and formed in the regions of the memory cell transistor Trm and the select gate transistor Trs1. The tunnel oxide film 2 is not formed in the regions immediately under and around the bit line contact CB.

The memory cell transistor Trm includes the memory cell gate electrode MG formed on the tunnel oxide film 2. The memory cell gate electrode MG includes a floating gate electrode (charge storage layer) FG, an inter-poly-dielectric (hereinafter briefly referred to as "IPD") 6, and a control gate electrode CG that are stacked in order on the tunnel oxide film 2. The floating gate electrode (charge storage layer) FG includes a polysilicon layer 3 doped with an impurity, in the present embodiment, boron (B).

The IPD 6 is an insulating film located between the floating gate electrode FG and the control gate electrode CG, and may be referred to as an inter-gate insulating film, an inter-conductive-layer insulating film, or an inter-electrode film. For example, a stack structure film composed of an oxide film, a nitride film, and an oxide film (ONO film) can be used as the IPD 6. In the present embodiment, a structure of $SiO_2$/SiN/$SiO_2$ is used. However, the IPD 6 is not limited to the above films, and a NONON film in which nitride films are formed before and after the above films may be used.

The control gate electrode CG includes a polysilicon layer 7 doped with an impurity, in the present embodiment, boron (B) as in the floating gate electrode (charge storage layer) FG, and a metal electrode layer 9 formed on the polysilicon layer 7. In the present embodiment, the metal electrode layer 9 is formed by a stack composed of tungsten (W) and tungsten nitride (WN).

As shown in FIG. 3, a plurality of memory cell transistors Trm are adjacently formed in the Y-direction. The select gate transistor Trs1 is formed adjacent to the memory cell transistor Trm.

The select gate electrode SGD of the select gate transistor Trs1 has a structure substantially similar to that of the memory cell gate electrode MG of the memory cell transistors Trm. For example, the polysilicon layer 3, the IPD 6, the polysilicon layer 7, and the metal electrode layer 9 are stacked in this order on the tunnel oxide film 2.

However, a through-hole is formed at the substantially central position of an inter-gate insulating film 6. The polysilicon layers 3 and 7 are in structural contact so that the function as the IPD 6 is nullified.

Although the sectional structure is not shown, the select gate electrode of the select gate transistor Trs2 also has a structure similar to that of the select gate electrode SGD.

An impurity diffused layer IDL is formed in a source/drain region 2a in the surface layer of the silicon substrate S in an inter-select-gate-electrode region in the Y-direction.

The memory cell gate electrode MG of the memory cell transistors Trm and the select gate electrode SGD of the select gate transistor Trs1 are provided in parallel in the Y-direction.

A silicon oxide film ($SiO_2$) 12 is formed over the memory cell gate electrode MG and the select gate electrode SGD. The silicon oxide film ($SiO_2$) 12 is formed so as to have lower coverage. As a result, an air gap AG is formed between the memory cell gate electrodes MG-MG. An inter-gate-electrode capacitance is reduced by the air gap AG. Similarly, an air gap AG is also formed between the memory cell gate electrode MG and the select gate electrode SGD.

A liner insulating film 50 which functions as a contact stopper is formed in the region of the memory cell transistor Trm, the region of the select gate transistor Trs1, and the region around the bit line contact CB. In the present embodiment, the liner insulating film 50 is formed by a stack composed of a silicon oxide film ($SiO_2$) 52 and a silicon nitride film (SiN) 54.

The liner insulating film 50 includes a part 50a formed on the silicon oxide film ($SiO_2$) 12 on the region located on the side of the memory cell transistor Trm within substantially half of the region on the memory cell transistor Trm and the select gate transistor Trs1, a part 50b on the region located on the side of the bit line contact region C within substantially half of the region on the select gate transistor Trs1, and a part 50c extending perpendicularly (Z-direction) along the sidewall of the silicon oxide film ($SiO_2$) 12 provided on the sidewall of the select gate electrode SGD from the upper surface of the silicon substrate S in the bit line contact region C.

An opening OP50b and an opening OP50a are respectively formed between the part 50a and the part 50b of the liner insulating film 50 and between the part 50b and the part 50c by local removal of the liner insulating film 50. The silicon oxide film ($SiO_2$) 12 is exposed in each of the openings.

A silicon oxide film ($SiO_2$) 20 is formed over the liner insulating film 50, and a contact hole CH is further formed in a bit line contact central region C1 within the silicon oxide film ($SiO_2$) 20.

A barrier metal 18 is formed on the bottom surface and side surface of the contact hole CH and on the silicon oxide film ($SiO_2$) 20. The bit line contact CB is formed so as to fill the contact hole CH with an electrode material such as tungsten (W) via the barrier metal 18, and is connected to the bit line BL formed on the silicon oxide film ($SiO_2$) 20.

(Manufacturing Method)

A manufacturing method of the semiconductor memory device shown in FIG. 1 to FIG. 3 is described with reference to FIG. 4 to FIG. 9.

Figure 4:
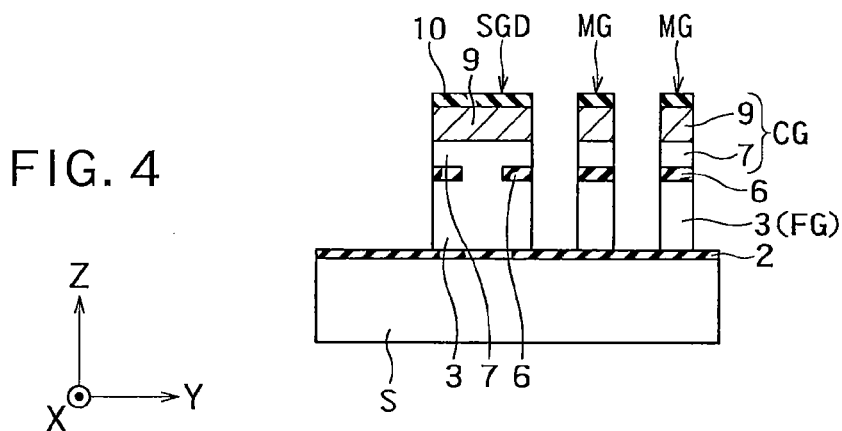
FIG. 4 to FIG. 9 are examples of schematic sectional views illustrating a manufacturing method of the semiconductor memory device shown in FIG. 1 to FIG. 3.

First, a tunnel oxide film 2 is formed on a semiconductor substrate S (see FIG. 4). A polysilicon layer 3 serving as the material for a floating gate electrode FG is then formed on the tunnel oxide film 2 by, for example, low-pressure chemical vapor deposition (CVD). In this instance, boron (B) which is a p-type impurity is used as an impurity.

Although not shown, the polysilicon layer 3, the tunnel oxide film 2, and the upper parts of the semiconductor substrate S are then selectively removed in the Y-direction parallel to the sheet of FIG. 4 by a photolithographic technique or an etching technique, and an element isolation trench ST (see FIG. 2) is thereby formed. The element isolation trench ST is then filled with an insulating film such as a silicon oxide ($SiO_2$) (not shown) by, for example, the CVD to form a shallow trench isolation (STI). Instead of the CVD, spin-coated silicon oxide ($SiO_2$) can also be used to fill the element isolation trench ST with the insulating film.

Although not shown, the floating gate electrode FG is then used as a stopper to planarize the surface by chemical mechanical polishing (CMP) until the floating gate electrode FG is exposed. For the improvement of a coupling ratio, the filling insulating film (silicon oxide ($SiO_2$) in the present embodiment) is etched back. As a result, an element region Sa (see FIG. 2) is divided into parts, and element isolation regions Sb (see FIG. 2) are defined.

An IPD 6 (see FIG. 4) is then formed using, for example, an ONO film by, for example, LP-CVD. In the present embodiment, a structure of $SiO_2/SiN/SiO_2$ is formed.

A polysilicon film is then formed on the IPD 6 by, for example, the CVD to form a polysilicon layer 7 (see FIG. 4). For the formation of the polysilicon film, boron (B) is added as an impurity as in the floating gate electrode FG.

A mask pattern (not shown) having an opening corresponding to a select gate part is then formed, and this mask pattern is used as a mask to selectively remove the polysilicon layer 7 and the IPD 6 and thereby provide an opening in the IPD of a select transistor (see FIG. 4). Instead of silicon oxide ($SiO_2$) and silicon nitride (SiN), a carbonaceous material can be used as the material of the mask pattern.

A metal electrode layer 9 (see FIG. 4) is then formed to form a control gate electrode CG together with the polysilicon layer 7, and silicon nitride (SiN) 10 (see FIG. 4) as a CAP material is then formed on the metal electrode layer 9. In the present embodiment, a stack of tungsten (W) and tungsten nitride (WN) is used as the material of the metal electrode layer 9. Detachment of the metal electrode layer 9 is prevented by the formation of tungsten nitride (WN) at the interface with the polysilicon layer 7 that constitutes a gate electrode layer 7.

Although not shown, a mask pattern for gate fabrication is then formed on the silicon nitride (SiN) 10. Instead of silicon oxide ($SiO_2$) and silicon nitride (SiN), a carbonaceous material can be used as the material of this mask pattern.

The silicon nitride (SiN) 10, the control gate electrode CG, the IPD 6, and the floating gate electrode (charge storage layer) FG are then selectively removed by RIE that uses the mask pattern for gate fabrication. As a result, as shown in FIG. 4, a select gate electrode SGD of a select gate transistor Trs1 and a memory cell gate electrode MG of a memory cell transistor Trm are formed.

Figure 5:
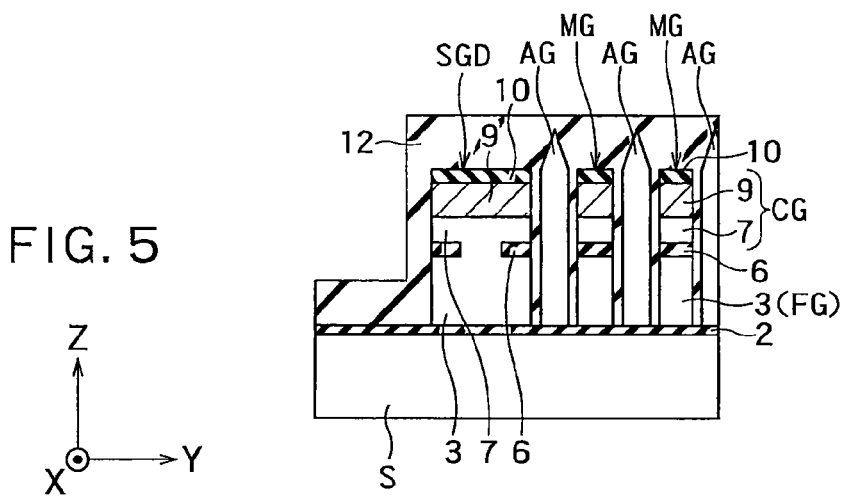

A low-coverage insulating film such as a silicon oxide ($SiO_2$) 12 is formed on the entire surface by, for example, the CVD. As a result, as shown in FIG. 5, air gaps AG are formed in the region between the memory cell gate electrodes MG and in the region between the select gate electrode SGD and the memory cell gate electrode MG.

Figure 6:
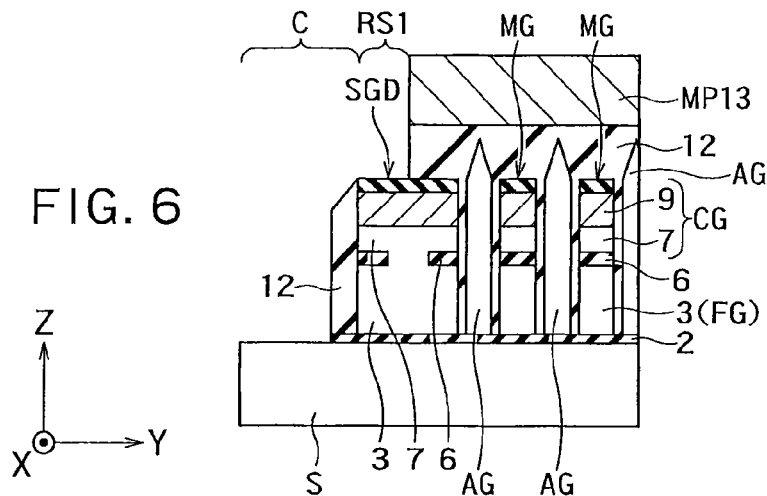

A mask pattern MP13 that opens a bit line contact region C and a region RS1 on the side of the bit line contact region C which is about half of the region on the select gate electrode SGD is then formed by patterning that uses a photoresist, and as shown in FIG. 6, a spacer is fabricated for the silicon oxide ($SiO_2$) 12 by, for example, the RIE. In the present embodiment, the bit line contact region C corresponds to, for example, a region between select transistors adjacent in the first direction.

The mask pattern MP13 and the select gate electrode SGD are then used as masks to implant impurity (phosphorus in the case of an n-type impurity) ions into the surface layer of the semiconductor substrate S in a self-aligning manner by an existing ion implantation method.

Figure 7:
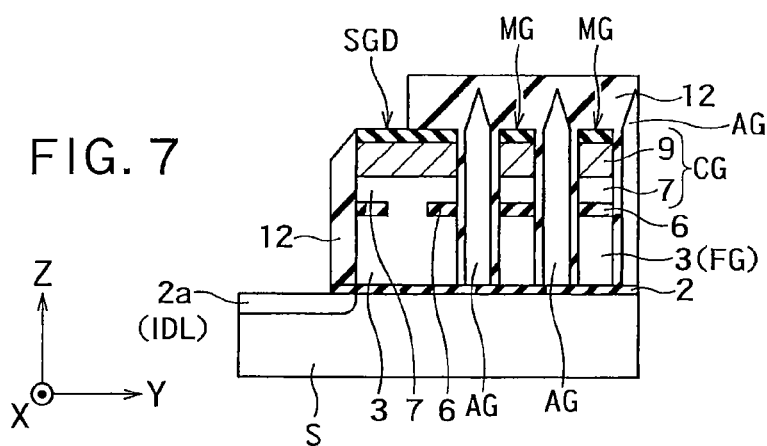

The impurity is then activated by annealing, and as shown in FIG. 7, an impurity diffused layer is formed as a source/drain region 2a between the select gate electrodes SGD (in the Y-direction).

Figure 8:
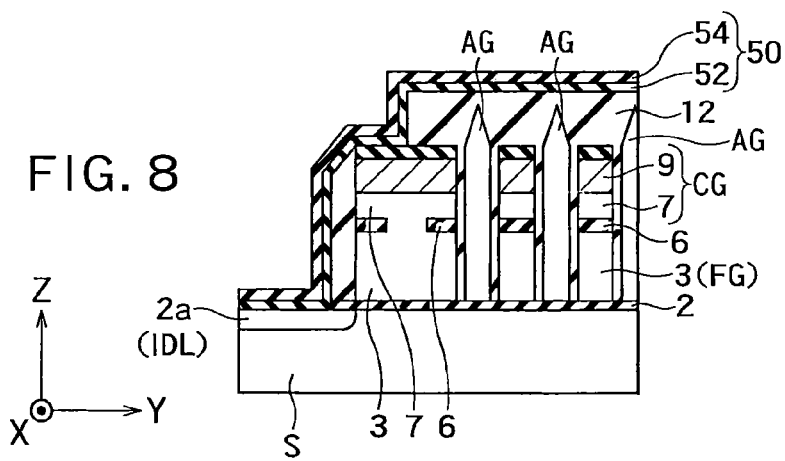

As shown in FIG. 8, silicon oxide ($SiO_2$) 52 and a silicon nitride (SiN) film 54 to be contact stoppers are then sequentially formed on the silicon oxide ($SiO_2$) 12. The silicon nitride (SiN) film 54 is formed by, for example, the CVD.

At the same time, boron (B) in the floating gate is inactivated because the formation temperature of the silicon nitride (SiN) is 600° C. to 800°. In case that a product is made with insufficiently activated boron (B), a depletion layer is produced in the floating gate electrode FG at the time of voltage application, and writing characteristics may deteriorate. Therefore, a thermal treatment at 950° C. or more is further conducted after the formation of the silicon nitride (SiN) film 54. Thus, boron (B) once inactivated is again activated.

Meanwhile, the impurity in the silicon oxide ($SiO_2$) 52 is diffused in the silicon oxide ($SiO_2$) 12 by the repeated thermal treatment, and some of the impurity may enter the memory via the sidewall of the air gap AG. In this case, there is a strong possibility that the operation accuracy of the memory cell may deteriorate. Thus, there is a trade-off between the activation of the floating gate electrode FG and the operation accuracy of the memory cell.

Thus, in the present embodiment, silicon oxide ($SiO_2$) is formed on the silicon nitride (SiN) film 54 by high density plasma (hereinafter briefly referred to as "HDP") CVD to fill the upper layer of the memory cell. As a result, a silicon oxide ($SiO_2$) 20 is formed while corner regions located in the vicinity of the select gate electrode SGD are etched in parts of the silicon nitride (SiN) film 54 and the silicon oxide ($SiO_2$) 52. In the present embodiment, the parts of the silicon nitride (SiN) film 54 and the silicon oxide ($SiO_2$) 52 removed by the etching during the formation of the silicon oxide ($SiO_2$) 20 correspond to, for example, a removed part.

Figure 9:
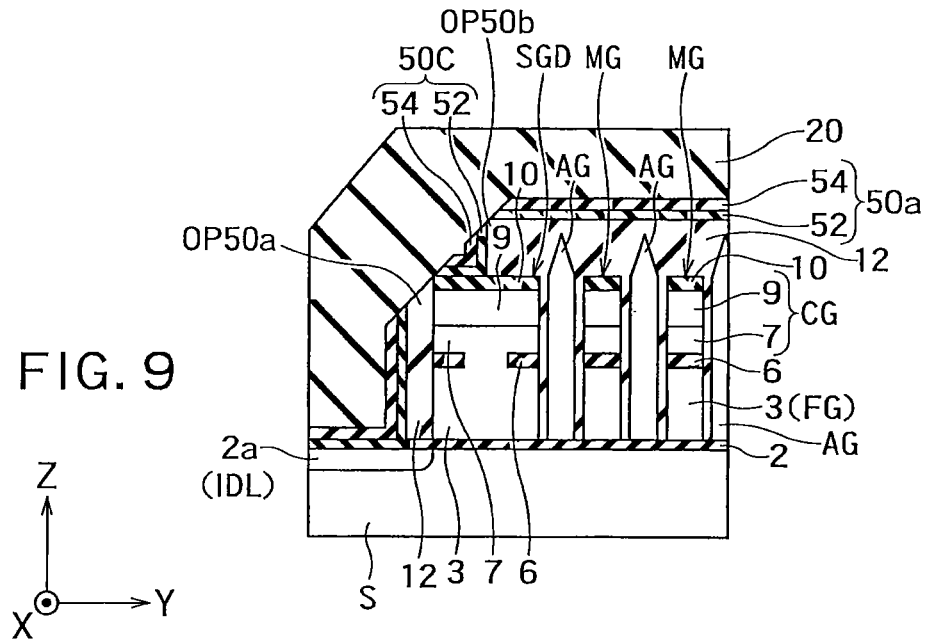

Thus, as shown in FIG. 9, openings OP50a and OP50b are formed in parts of the silicon nitride (SiN) film 54 and the silicon oxide ($SiO_2$) 52. Because of the presence of the openings OP50a and OP50b, the impurities in the silicon nitride (SiN) film 54 and the silicon oxide ($SiO_2$) 52 diffuse into the silicon oxide ($SiO_2$) 20 even if a high-temperature activation treatment is conducted later. Thus, the impurities do not diffuse to the memory cell transistor Trm and the select gate transistor Trs1. Consequently, the operation accuracy of the memory cell can be improved.

Furthermore, the impurities present around the memory cell transistor Trm and the select gate transistor Trs1 can also be discharged into the silicon oxide ($SiO_2$) 20 through the openings OP50a and OP50b. Thus, the operation accuracy of the memory cell can be further improved.

The openings OP50a and OP50b may be provided not only by the HDPCVD but by dry etching of, for example, asher.

The silicon nitride (SiN) film 54 does not need to be completely opened, and the liner insulating film 50 has only to be reduced to a thickness that permits the transmission of the impurity, for example, to 3 nm or less.

After the upper part of the memory cell is then planarized by CMP, a contact hole CH is formed by photolithography and RIE, and titanium (Ti)/titanium nitride (TiN) 18 to be a barrier metal is formed, and then the contact hole CH is filled with an electrode material such as tungsten to form a contact CB and a bit line BL. As a result, the semiconductor memory device shown in FIG. 3 is provided.

(2) Second Embodiment (Device Configuration)

Figure 10:
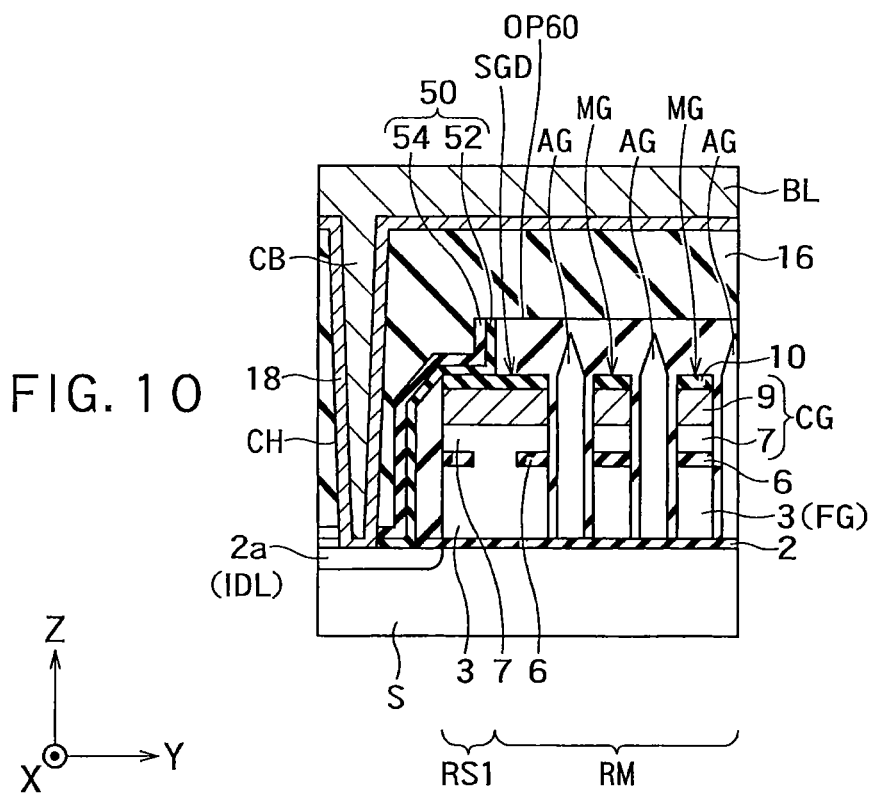
FIG. 10 is an example of a sectional view showing a schematic configuration of a semiconductor memory device manufactured by a manufacturing method of a semiconductor device according to a second embodiment.

FIG. 10 is an example of a sectional view showing a schematic configuration of a semiconductor memory device manufactured by a manufacturing method of a semiconductor device according to a second embodiment.

To describe by contrast with FIG. 3, a first characteristic of the semiconductor memory device shown in FIG. 10 is that silicon oxide ($SiO_2$) 16 is provided instead of the silicon oxide ($SiO_2$) 20. Moreover, a second characteristic of the semiconductor memory device shown in FIG. 10 is that the silicon oxide ($SiO_2$) 52 and the silicon nitride (SiN) film 54 to be contact stoppers in a region RM except for a region RS1 (see FIG. 6) are partly removed in the regions of the memory cell transistor Trm and the select gate transistor Trs1, and an opening OP60 substantially parallel to the upper surface of the semiconductor substrate S is formed.

As in the first embodiment, the impurities in the silicon nitride (SiN) film 54 and the silicon oxide ($SiO_2$) 52 diffuse into the silicon oxide ($SiO_2$) 16 owing to this opening OP60 as well. Therefore, the diffusion of the impurities into the memory cell transistor Trm and the select gate transistor Trs1 is prevented.

Furthermore, the impurities present around the memory cell transistor Trm and the select gate transistor Trs1 are discharged into the silicon oxide ($SiO_2$) 16 through the opening OP60. Thus, the operation accuracy of the memory cell can be improved.

(Manufacturing Method)

A manufacturing method of the semiconductor memory device shown in FIG. 10 is described with reference to FIG. 11 and FIG. 12.

The processes from the formation of the memory cell transistor Trm and the select gate transistor Trs1 to the formation of the air gap AG, the formation of the source/drain region 2a, the formation of the liner insulating film 50, and the reactivation of boron (B) are similar to those in the first embodiment described above with reference to FIG. 4 to FIG. 8.

Figure 11:
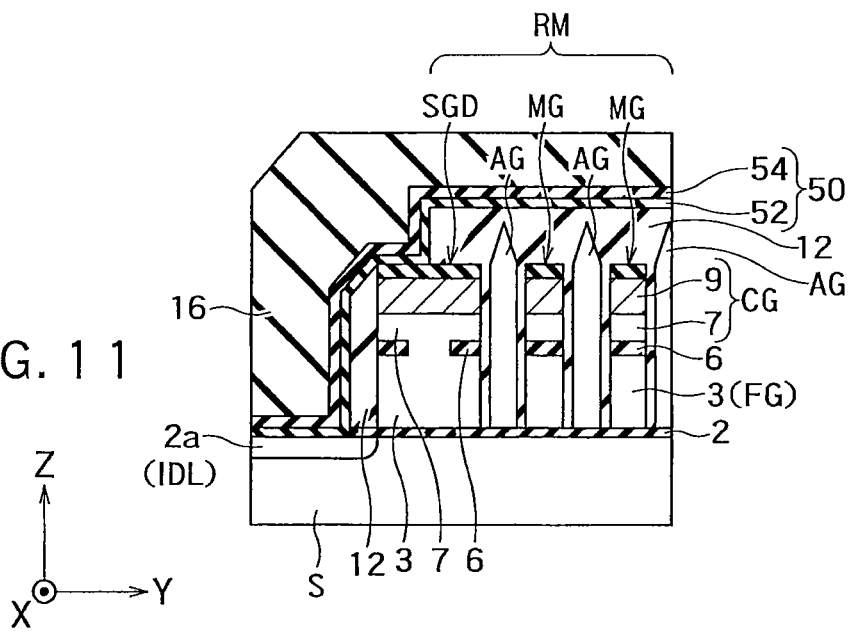
FIG. 11 and FIG. 12 are examples of schematic sectional views illustrating a manufacturing method of the semiconductor memory device shown in FIG. 10.
Figure 12:
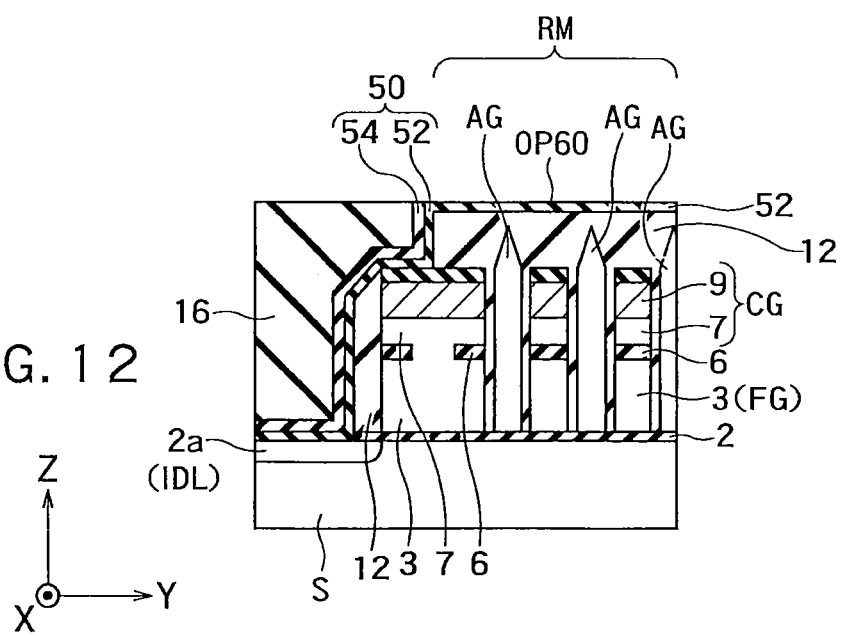

In the present embodiment, after the reactivation of boron (B) by a thermal treatment, a silicon oxide ($SiO_2$) 16 is formed to fill the upper layers of the memory cell transistor Trm and the select gate transistor Trs1 by normal CVD, as shown in FIG. 11.

The region RM of the memory cell transistor Trm and the select gate transistor Trs1 is then planarized by CMP. In this instance, the silicon nitride (SiN) film 54 on the surface is removed by further overetching than that in the planarization process in the first embodiment. Thus, as shown in FIG. 12, the opening OP60 extending over the wide region RM on the cell top can be formed. When it is difficult to form the opening by the CMP alone, RIE or wet etching may be used together. In the present embodiment, remaining parts of the silicon nitride (SiN) film 54 and the silicon oxide ($SiO_2$) 52 removed by the etching correspond to, for example, the removed part.

As in the first embodiment described above, the silicon nitride (SiN) film 54 does not need to be removed until the opening OP60 is completely provided, and the liner insulating film 50 has only to be reduced to a thickness that permits the transmission of the impurity, for example, to 3 nm or less. In the present embodiment, the liner insulating film 50 corresponds to, for example, a first insulating film.

A contact hole CH is then formed by photolithography and RIE, and titanium (Ti)/titanium nitride (TiN) 18 to be a barrier metal is formed. Further, the contact hole CH is filled with an electrode material such as tungsten (W) to form a contact CB and a bit line BL. As a result, the semiconductor memory device shown in FIG. 10 is provided.

(3) Third Embodiment (Device Configuration)

Figure 13:
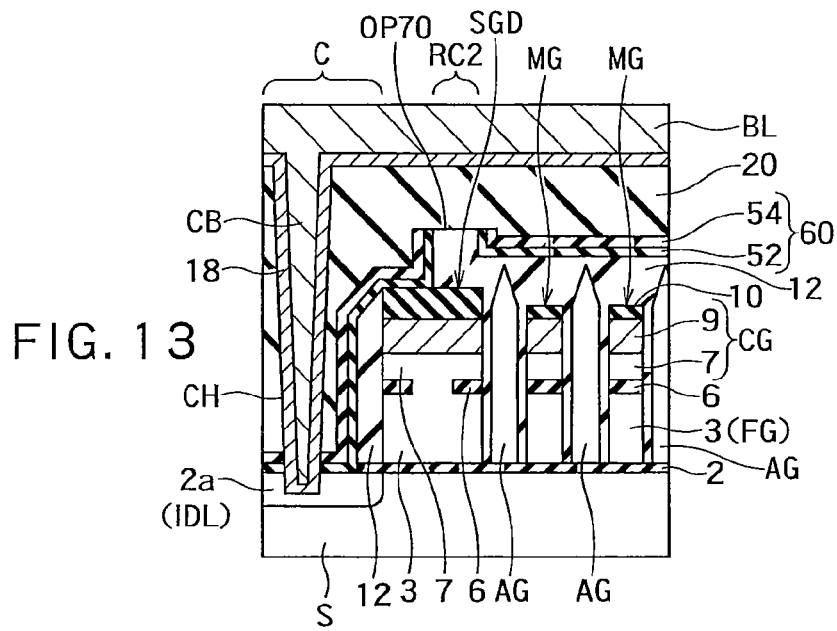
FIG. 13 is an example of a sectional view showing a schematic configuration of a semiconductor memory device manufactured by a manufacturing method of a semiconductor device according to a third embodiment.

FIG. 13 is an example of a sectional view showing a schematic configuration of a semiconductor memory device manufactured by a manufacturing method of a semiconductor device according to a third embodiment.

For example, to describe by contrast with FIG. 10, the semiconductor memory device shown in FIG. 13 mainly has two characteristics.

The first characteristic is that the silicon nitride (SiN) 10 as the CAP material formed on the metal electrode layer 9 in an about half region RS2 located on the side opposite to the bit line contact region C within the region on the select gate electrode SGD is formed to be thicker than the other regions on the memory cell gate electrode MG. This occurs when the whole area of the NAND cell unit SU (see FIG. 1) is large.

The second characteristic is that a liner insulating film 60 is formed instead of the liner insulating film 50 shown in FIG. 10, and this liner insulating film 60 is selectively removed in the region RS2 on the select gate electrode SGD, so that an opening OP70 substantially parallel to the upper surface of the semiconductor substrate S is formed. As in the first and second embodiments, this opening OP70 also prevents the diffusion of the impurities in the silicon nitride (SiN) film 54 and the silicon oxide ($SiO_2$) 52 into the silicon oxide ($SiO_2$) 16 and the diffusion of the impurities to the memory cell transistor Trm and the select gate transistor Trs1.

Furthermore, the impurities present around the memory cell transistor Trm and the select gate transistor Trs1 are discharged into the silicon oxide ($SiO_2$) 20 through the opening OP70. Thus, the operation accuracy of the memory cell can be improved.

(Manufacturing Method)

A manufacturing method of the semiconductor memory device shown in FIG. 13 is described with reference to FIG. 14 and FIG. 15.

Figure 14:
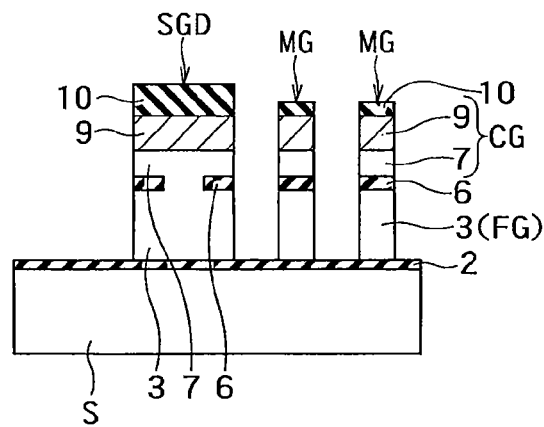
FIG. 14 and FIG. 15 are examples of schematic sectional views illustrating a manufacturing method of the semiconductor memory device shown in FIG. 13.

FIG. 14 shows an example of a schematic sectional view of the memory cell gate electrode MG and the select gate electrode SGD obtained during the manufacture of the NAND cell unit SU having a total area larger than that in the first and second embodiments.

As obvious from the comparison with FIG. 4, the silicon nitride (SiN) 10 as the CAP material provided on the select gate electrode SGD is formed to be thicker than the silicon nitride (SiN) 10 of the other memory cell gate electrodes MG.

For the memory cell gate electrode MG and the select gate electrode SGD having the above shapes, the formation of the air gap AG by the formation of the silicon oxide ($SiO_2$) 12, the spacer fabrication in the silicon oxide ($SiO_2$) 12, the implantation of impurity ions and annealing, and the formation of the silicon oxide ($SiO_2$) 52 and the silicon nitride (SiN) film 54 to be contact stoppers on the silicon oxide ($SiO_2$) 12 are sequentially carried out in the same manner as in the first and second embodiments described above.

Figure 15:
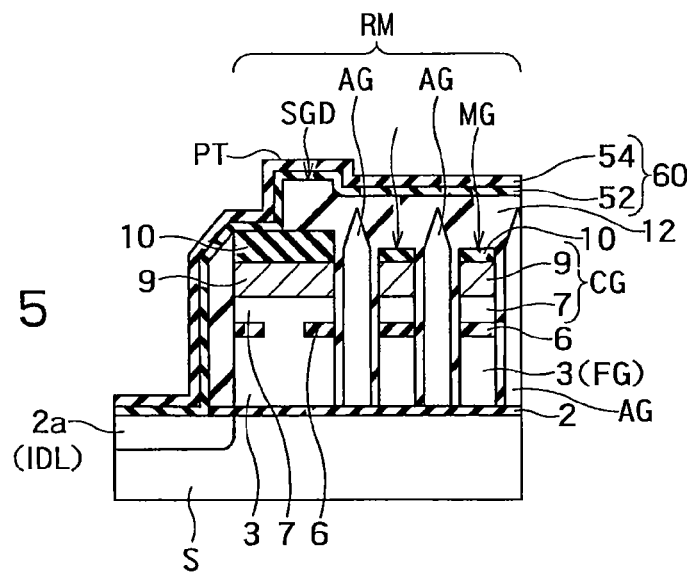

Thus, as shown in FIG. 15, a liner insulating film 60 which is formed by the silicon oxide ($SiO_2$) 52 and the silicon nitride (SiN) film 54 that are sequentially formed on the silicon oxide ($SiO_2$) 12 and which has a protrusion PT in the RS2 on the select gate electrode SGD is obtained. In the present embodiment, the liner insulating film 60 corresponds to, for example, the first insulating film.

A silicon oxide film ($SiO_2$) 20 is then formed over the liner insulating film 60, and the region RM of the memory cell transistor Trm and the select gate transistor Trs1 is then planarized by CMP until the liner insulating film 60 in the protrusion PT is removed. As a result, an opening OP70 (see FIG. 13) in the silicon oxide ($SiO_2$) 12 is formed substantially parallel to the upper surface of the semiconductor substrate S. In the present embodiment, the part of the liner insulating film 60 in the protrusion PT removed by the CMP corresponds to, for example, the removed part.

The silicon nitride (SiN) film 54 does not need to be completely opened, and the liner insulating film 60 has only to be reduced to a thickness that permits the transmission of the impurity, for example, to 3 nm or less.

The silicon oxide film ($SiO_2$) 20 is then formed on the entire surface again, and the upper parts of the select gate transistor Trs1 and the memory cell transistor Trm are planarized by the CMP. A contact hole CH is then formed by photolithography and RIE, and titanium (Ti)/titanium nitride (TiN) 18 to be a barrier metal is formed. The contact hole CH is then filled with an electrode material such as tungsten (W) to form a contact CB and a bit line BL. As a result, the semiconductor memory device shown in FIG. 13 is provided.

(4) Fourth Embodiment (Device Configuration)

Figure 16:
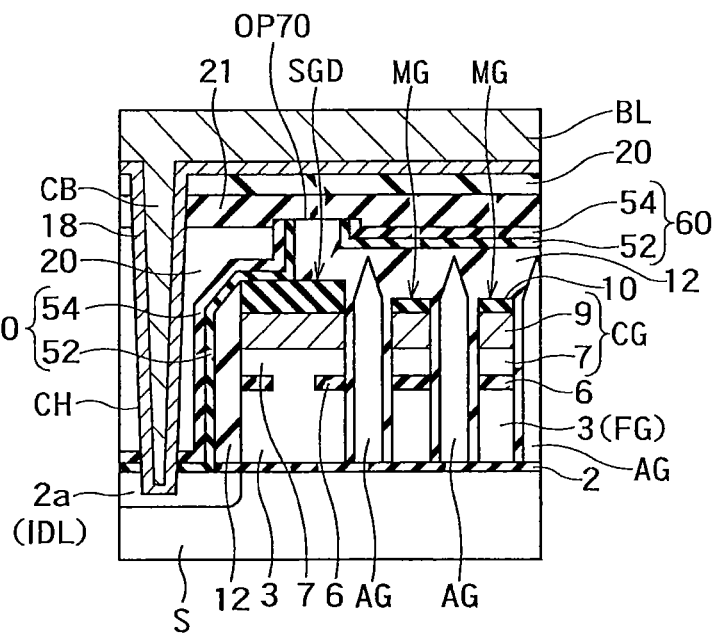
FIG. 16 is an example of a sectional view showing a schematic configuration of a semiconductor memory device manufactured by a manufacturing method of a semiconductor device according to a fourth embodiment.

FIG. 16 is an example of a sectional view showing a schematic configuration of a semiconductor memory device manufactured by a manufacturing method of a semiconductor device according to a fourth embodiment.

Figure 17:
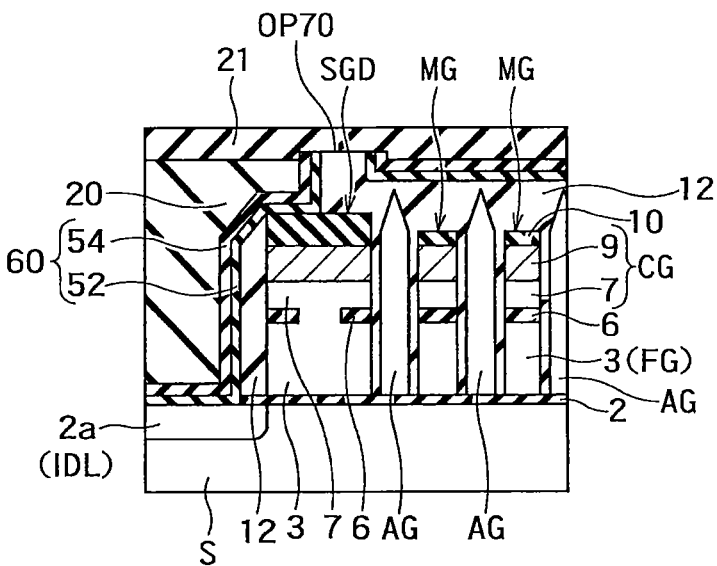
FIG. 17 is an example of a schematic sectional view illustrating a manufacturing method of the semiconductor memory device shown in FIG. 16.

As obvious from the comparison with FIG. 13, the semiconductor memory device shown in FIG. 17 further includes a silicon nitride (SiN) film 21 formed so as to close the opening OP70 in a region on the liner insulating film 60 except for the contact hole CH, in addition to the configuration of the semiconductor memory device shown in FIG. 13.

In the semiconductor memory device shown in FIG. 13, the silicon oxide film ($SiO_2$) 20 is directly formed so as to close the opening OP70. Therefore, contamination from the upper metal wiring line (e.g. the bit line BL) or an impurity such as $H_2O$ from the upper interlayer insulating films (e.g. the silicon oxide film ($SiO_2$) 20) may diffuse into the vicinities of the select gate transistor Trs1 and the memory cell transistor Trm.

In the present embodiment, the opening OP70 is closed by the silicon nitride (SiN) film 21, so that the select gate transistor Trs1 and the memory cell transistor Trm are protected from the diffusion of the contamination and the impurity.

(Manufacturing Method)

To manufacture the semiconductor memory device shown in FIG. 16, first, as in the third embodiment described above, a silicon oxide film ($SiO_2$) 20 is formed over the liner insulating film 60 after the process shown in FIG. 15, and the region RM of the memory cell transistor Trm and the select gate transistor Trs1 is then planarized by CMP until the liner insulating film 60 in the protrusion PT is removed. As a result, an opening OP70 (see FIG. 13) in the silicon oxide ($SiO_2$) 12 is formed substantially parallel to the upper surface of the semiconductor substrate S. In the present embodiment, the part of the liner insulating film 60 in the protrusion PT removed by the CMP corresponds to, for example, the removed part.

As shown in FIG. 17, a silicon nitride (SiN) film 21 is then formed in the region on the liner insulating film 60 at a low temperature so as to close the opening OP70. A specific formation temperature of the silicon nitride (SiN) film 21 is preferably a temperature at which boron is not inactivated, for example, 600° C. or less. The silicon nitride (SiN) film 21 is formed by such a method as ALD or plasma CVD. In the present embodiment, the silicon nitride (SiN) film 21 corresponds to, for example, a second insulating film.

Subsequently, as in the third embodiment described above, a silicon oxide film ($SiO_2$) 20 is again formed on the entire surface, and the upper parts of the select gate transistor Trs1 and the memory cell transistor Trm are planarized by the CMP. A contact hole CH is then formed by photolithography and RIE, and titanium (Ti)/titanium nitride (TiN) 18 to be a barrier metal is formed. The contact hole CH is then filled with electrode material tungsten to form a contact CB and a bit line BL. As a result, the semiconductor memory device shown in FIG. 16 is provided.

While certain embodiments have been described, these embodiments have been presented by way of example only, and are not intended to limit the scope of the inventions.

For example, although the memory cell transistor and the select transistor are formed on the semiconductor substrate S in the aspect of the embodiments described above, the substrate on which the semiconductor memory device is formed is not limited to the semiconductor substrate. The semiconductor memory device may be formed on some other substrate such as a glass substrate or a ceramic substrate as long as such a substrate has a semiconductor layer on the surface thereof.

Indeed, the novel methods and systems described herein may be embodied in a variety of other forms; furthermore, various omissions, substitutions and changes in the form of the methods and systems described herein may be made without departing from the spirit of the inventions.

For example, although the silicon nitride (SiN) film 21 which closes the opening OP70 has been only shown as the silicon nitride (SiN) film which closes the opening provided in the liner insulating film in the embodiments described above, the silicon nitride (SiN) film is not limited to this film. For example, in the semiconductor memory device according to the second embodiment, a silicon nitride (SiN) film which closes the opening OP60 may be further formed.

The accompanying claims and their equivalents are intended to cover such forms or modifications as would fall within the scope and spirit of the inventions.

The invention claimed is:

1. A manufacturing method of a semiconductor device, the method comprising:
    forming a plurality of memory cells and a plurality of select transistors on a semiconductor substrate in such a manner that the memory cells and the select transistors are arranged at predetermined intervals in a second direction that intersects with a first direction, the memory cells being connected in series in the first direction, the select transistors being connected in series to the memory cells in the first direction to select any memory cell to record or read, an impurity being introduced in gate parts of the select transistors;
    forming a first insulating nitride film which covers the semiconductor substrate between the select transistors adjacent in the first direction, the select transistors, and the memory cells;
    partly removing the first insulating nitride film formed between the select transistors adjacent in the first direction, and forming, in the removed part, a contact which contacts the semiconductor substrate; and
    selectively removing the first insulating nitride film in a region other than the region in which the contact is formed and in a region above the select transistors or the memory cells.

2. The method of claim 1,
wherein the first insulating nitride film is completely removed in the removed part.

3. The method of claim 1,
wherein the thickness of the first insulating nitride film in the removed part is 3 nm or less.

4. The method of claim 1,
wherein the first insulating nitride film comprises a corner above the select transistors facing across the contact in the first direction, and
the removed part is present at the corner.

5. The method of claim 4,
wherein the first insulating nitride film is also selectively removed in the side parts of the select transistors on the side of the contact.

6. The method of claim 1,
wherein the removed part is present above the select transistors.

7. The method of claim 1,
further comprising forming a second insulating nitride film which closes the removed part.

8. The method of claim 1,
wherein the impurity is boron (B).

* * * * *